United States Patent
Ding et al.

(10) Patent No.: US 11,030,378 B1
(45) Date of Patent: Jun. 8, 2021

(54) TRACK ASSIGNMENT BY DYNAMIC PROGRAMMING

(71) Applicant: Cadence Design Systems, Inc., San Jose, CA (US)

(72) Inventors: Yi-Xiao Ding, Austin, TX (US); Mehmet Can Yildiz, Austin, TX (US); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/904,534

(22) Filed: Jun. 17, 2020

(51) Int. Cl.
 *G06F 30/3947* (2020.01)
 *G06F 30/392* (2020.01)

(52) U.S. Cl.
 CPC ........ *G06F 30/3947* (2020.01); *G06F 30/392* (2020.01)

(58) Field of Classification Search
 CPC ...... G06F 30/30; G06F 30/347; G06F 30/392; G06F 30/394; G06F 30/3947
 USPC ........................................ 716/100, 126, 129
 See application file for complete search history.

(56) References Cited

U.S. PATENT DOCUMENTS

2006/0288323 A1\* 12/2006 Birch ................... G06F 30/394
 716/129
2007/0028201 A1\* 2/2007 Mehrotra .............. G06F 30/394
 716/129

\* cited by examiner

*Primary Examiner* — Paul Dinh
(74) *Attorney, Agent, or Firm* — Schwegman Lundberg & Woessner, P.A.

(57) ABSTRACT

Various embodiments described herein provide for track assignment of wires of a network of a circuit design by dynamic programming. In particular, various embodiments use a dynamic programming process to determine a set of breaking points for a routing wire of a global-routed and layer-assigned circuit design, and to determine track assignments for each of the sub-wires (sub-routes) formed by applying the set of selected breaking points to the routing wire. This results in a set of track-assigned sub-wires (or track-assigned sub-routes), which various embodiments can connect together to generate a connected set of track-assigned sub-wires that can be used in place of the routing wire.

20 Claims, 10 Drawing Sheets

US 11,030,378 B1

TRACK ASSIGNMENT BY DYNAMIC PROGRAMMING

TECHNICAL FIELD

Embodiments described herein relate to circuit design and, more particularly, to systems, methods, devices, and instructions for track assignment of wires of a network of a circuit design by dynamic programming, which may be part of electronic design automation (EDA).

BACKGROUND

Electronic design automation (EDA) is a category of systems for assisting with the design of electronic systems and devices. Traditional EDA systems include global routing and tracking assignment with respect to a circuit design, whereby a network of the circuit design is two-dimensional (2D) routed, one or more portions of the 2D routed network (e.g., global routing solution) are assigned to one or more layers (e.g., metal layers) of the circuit design, and one or more sub-portions (e.g., wires) of each layer-assigned portion are assigned to one or more tracks of the layer (e.g., horizontal and vertical tracks). For example, given a two-dimensional global routing tree for a circuit design, layer assignment of the circuit design can divide the 2D global routing tree into a list of nodes, can assign those nodes onto routing layers, and can assign wires between nodes to tracks of routing layers.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
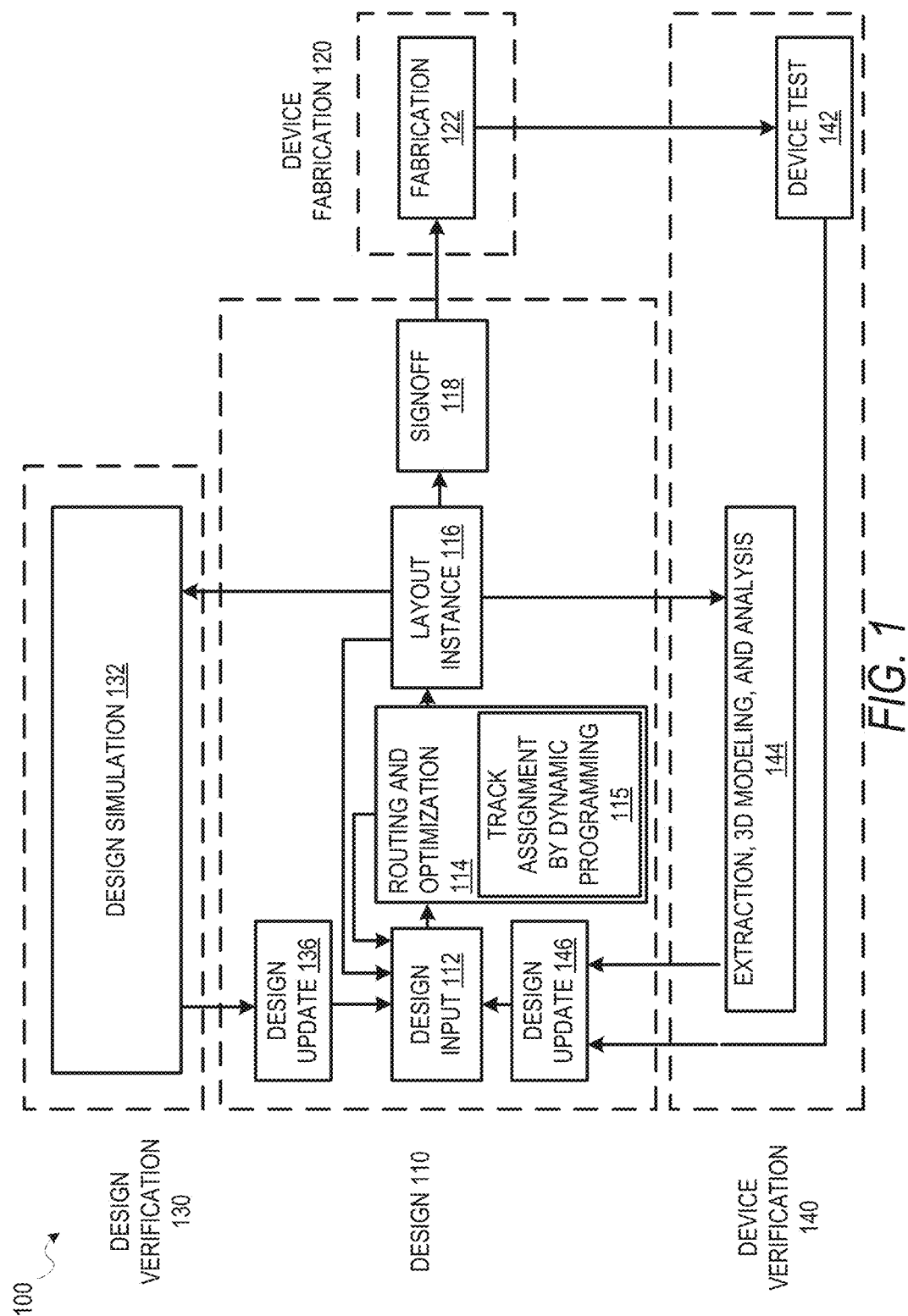
FIG. 1 is a diagram illustrating an example design process flow for track assignment of wires of a network of a circuit design by dynamic programming, according to some embodiments.

Generally, track assignment is performed between global routing and detailed routing, where global routing determines which grid cells a network of a circuit design will pass through, and where track assignment determines which track a wire of the network is located on. Thereafter, detailed routing can route wires within a local region of the circuit design (e.g., within a grid cell) and resolve design rules (DRCs) by the routing. Recently, track assignment has become particularly important in guiding detailed routing with the increase in number of non-default design rules used for advanced technology nodes. Suboptimal or bad track assignment selection can lead to detailed routing spending long runtime on design rule constraint (DRC) resolutions, bad routing patterns being generated, or DRC not being resolved at all. Generally, traditional track assignment of wires and, more specifically, routing wires (e.g., wires spanning two or more grid cells) has involved extracting routing wires from global routing, choosing a range of tracks to assign each routing wire, and then, for each routing wire, computing a cost to assign to each track inside the range. Eventually, a routing wire is assigned to the track providing the minimum cost. Such traditional methodologies keep the routing wires whole during track assignment, and attempt to minimize cost while aligning routing wires as much as possible (e.g., by adding cost for misalignment).

Various embodiments described herein provide for track assignment of wires of a network of a circuit design by dynamic programming, which may be part of electronic design automation (EDA). As used herein, a routing wire can comprise a wire of a network that spans two or more grid cells, either vertically or horizontally. According to some embodiments, track assignment of a routing wire is facilitated by determining (e.g., identifying or extracting) a set of routing wires of a network of a circuit design after global routing. This can be accomplished by traversing a network source (net source) of a three-dimensional (3D) routed network (e.g., global routing solution followed by layer assignment) and identifying or creating a routing wire when a turning point (e.g., Steiner point) is encountered. The routing wire can pass through the turning point (e.g., Steiner point) to form a super-routing wire. After determining the set of routing wires of the network, various embodiments determine (e.g., select) a set of candidate breaking points (or segmentation points) with respect to an individual routing wire (e.g., set for each individual routing wire of the network). As used herein, a sub-wire (sub-route) refers to a wire segment of a routing wire formed by breaking (or segmenting) the routing wire at a breaking point (or segmentation point). Subsequently, various embodiments use a dynamic programming process to determine (e.g., select) a set of selected breaking points for the individual routing wire and track assignments for each of the sub-wires (sub-routes) formed by applying the set of selected breaking points to the individual routing wire. This results in a set of track-assigned sub-wires (or track-assigned sub-routes). For each selected breaking point, various embodiments connect the track-assigned sub-wires formed, thereby resulting in a connected set of track-assigned sub-wires, which can be used in place of the individual routing wire. Due to the connections between track-assigned sub-wires, jogging would result in the circuit design. For some embodiments, the dynamic programming process determines the set of selected breaking points and the track assignments for the sub-wires by determining a cost of assigning each candidate sub-wire (formed by applying the set of candidate breaking points to the individual routing wire) to each available track. In doing so, the dynamic programming process can integrate cost into track assignment of sub-wires (sub-routes) and can achieve track assignments that are more optimal than those achieved by conventional methodologies.

By use of various embodiments, track assignment of wires, especially routing wires, can be more optimal than track assignment achieved by conventional track assignment methodologies. Various embodiments can enable a computing device to perform track assignment faster than using conventional track assignment methodologies. Additionally, various embodiments can make it easier to integrate costs into a track assignment process, which in turn makes it easier for a track assignment process to consider a plurality of design rules during track assignment of wires. In comparison to a circuit design produced using a conventional track assignment process, the track assignment of various embodiments can produce a circuit design that has less blockage violations, that has smaller wire and blockage overlap length (e.g., by jogging around vias to avoid blockage overlap), or both.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical tracks) for routing the wire. For some embodiments, each layer of a circuit design comprises its own grid of cells (e.g., grid cells). Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailed routing can route a physical wire between two or more nodes (e.g., pins) of a circuit design.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more DRCs associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for track assignment of wires of a network of a circuit design by dynamic programming, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes a track assignment by dynamic programming 115 operation (hereafter, the track assignment 115 operation), which may be performed in accordance with various embodiments described herein. For some embodiments, a track assignment 115 operation can be performed prior to detailed routing of a circuit design, after global routing of the circuit design or after layer assignment of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance.

As described in more detail below, a design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
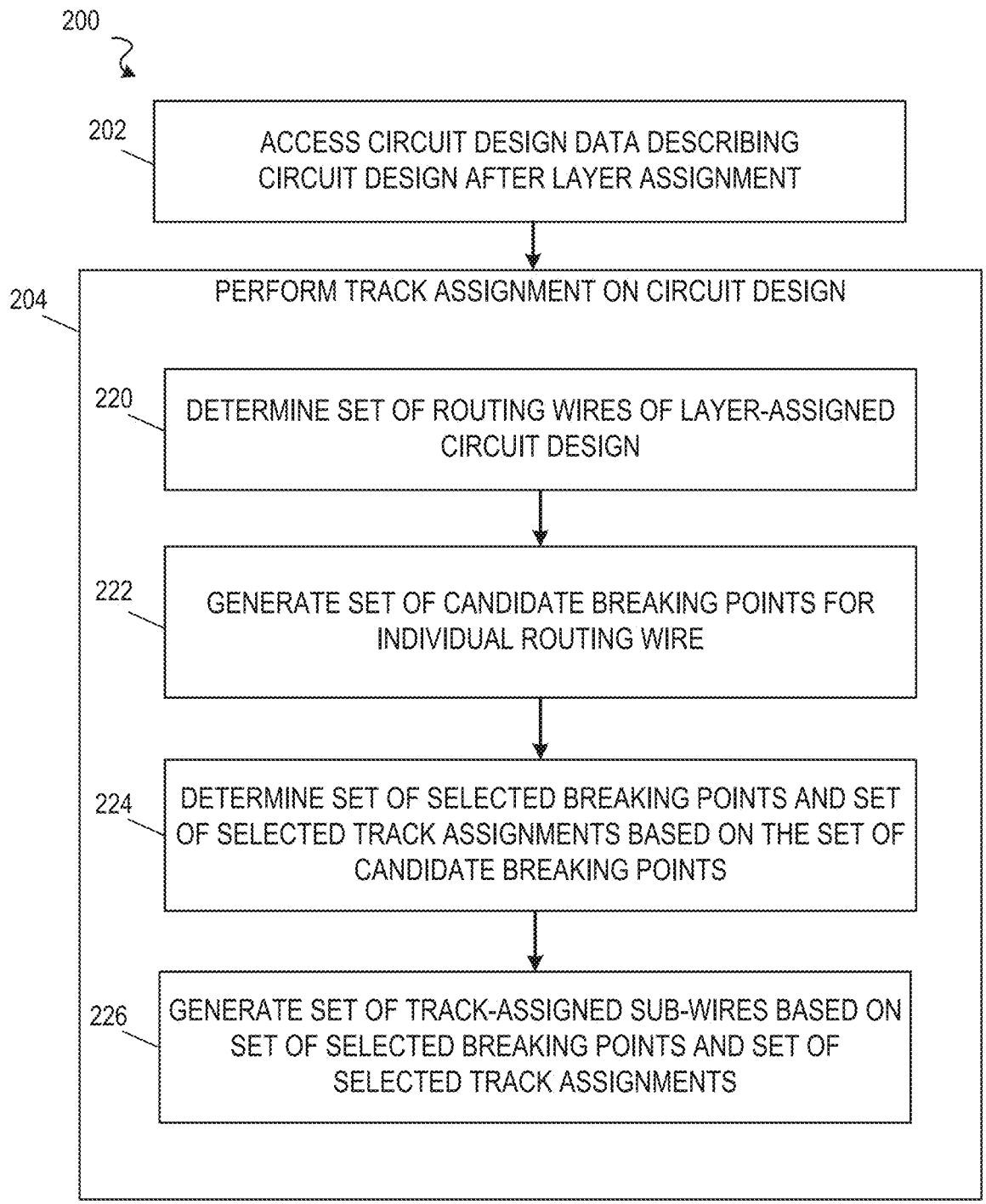
FIGS. 2 and 3 are flowcharts illustrating example methods for track assignment of wires of a network of a circuit design by dynamic programming, according to some embodiments.
Figure 3:
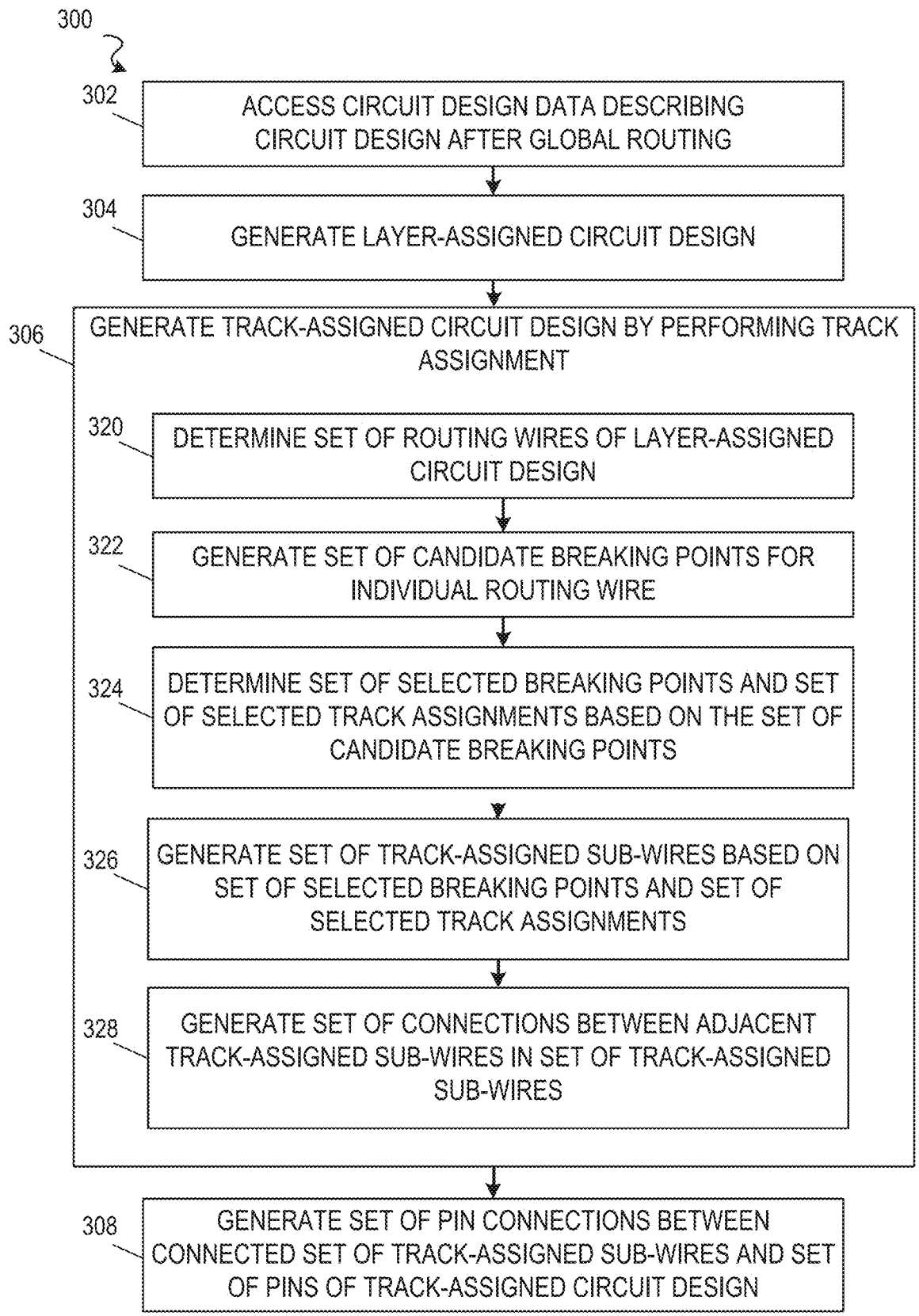

FIGS. 2 and 3 are flowcharts illustrating example methods for track assignment of wires of a network of a circuit design by dynamic programming, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for track assignment of wires of a network of a circuit design by dynamic programming, according to some embodiments. For some embodiments, one or more operations of the method 200 are performed as part of a global routing process performed with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

As illustrated, at operation 202, circuit design data is accessed, where the design data describes a circuit design after layer assignment is performed on a circuit design (where the layer assignment results in a layer-assigned circuit design). For some embodiments, the layer assignment is performed on a circuit design after global routing on the circuit design (where the global routing results in a global-routed circuit design). Accordingly, the circuit design comprises one or more two-dimensional (2D) routed networks that connect nodes (e.g., pins or vias) of the circuit design together according to a netlist that describes the circuit design. The layer assignment can comprise a process that layer assigns different portions of a 2D routed network to different layers of the circuit design.

Thereafter, operation 204 performs track assignment on the layer-assigned circuit design based on the circuit design data (accessed by operation 202), which can result in a track-assigned circuit design. As shown, operation 204 comprises performing operations 220 through 226. At operation 220, a set of routing wires of the layer-assigned circuit design is determined (e.g., extracted or identified). For some embodiments, each routing wire in the set of routing wires spans two or more grid cells of a layer of the circuit design. Each routing wire is intended to serve as a route that connects together two or more nodes (e.g., pins or vias) of a 2D routed network of the circuit design on an individual layer of the circuit design.

Subsequently, operation 222 generates a set of candidate breaking points for an individual routing wire in the set of routing wires determined by operation 220. For some embodiments, each candidate breaking point (in the set of candidate breaking points) represents or corresponds to a location on the individual routing wire at which to potentially form a break in the individual routing wire to generate two sub-wires. As described herein, in doing so, the two sub-wires that result can be assigned to tracks at different levels, which can assist in avoiding blockages or reducing overlap of wires. Depending on the embodiment, a candidate breaking point in the set of candidate breaking points can be disposed (e.g., placed) at a location on the individual routing wire where the individual routing wire starts or where the individual routing wire ends. A candidate breaking point in the set of candidates breaking points can be disposed (e.g., placed) at a location on the individual routing wire where the individual routing wire intersects a boundary of a grid cell that contains a portion of a circuit design blockage. Additionally, a candidate breaking point in the set of candidates breaking points can be disposed (e.g., placed) at a location on the individual routing wire where the individual routing wire intersects a boundary of a grid cell that has (e.g., is experiencing) routing congestion (which can enable the track assignment to break wires to reduce routing congestion).

Operation 224 determines a set of selected breaking points and a set of selected track assignments based on the set of candidate breaking points generated by operation 222. For some embodiments, operation 224 uses a dynamic programming process to determine (e.g., select) the set of selected breaking points from the set of candidate breaking points, and to determine (e.g., select) track assignments for each of sub-wires that results from applying the set of selected breaking points to the individual wire, thereby resulting in the set of selected track assignments. As described herein, the dynamic programming process can consider one or more costs to determine (e.g., select) the set of selected breaking points and the set of selected track assignments.

For some embodiments, the dynamic programming process comprises determining a potential cost of assigning a candidate sub-wire (that is formed between two candidate breaking points in the set of candidate breaking points) to an individual track. For example, according to some embodiments, the dynamic programming process comprises determining a set of candidate sub-wires from the individual routing wire based on the set of candidate breaking points and then, for each candidate sub-wire in the set of candidate sub-wires, determining a set of potential costs of assigning the candidate sub-wire to each track available to the candidate sub-wire (e.g., tracks available within the one or more grid cells that contain the candidate sub-wire). Eventually, the dynamic programming process can determine the set of selected breaking points and the set of selected track assignments based on the sets of potential costs generated for the set of candidate sub-wires. Depending on the embodiment, the potential cost can be based on whether assigning the candidate sub-wire to the individual track results in wire overlap, or based on whether the individual track comprises at least one of a shield track, a blocked track, or a non-default routing track. The potential cost can provide a way to integrated various constraints or optimizations in to the track assignment process. Example equations for determining potential costs of assigning a sub-wire to a track based on different conditions are provided in Table 1 below, where $GCell_{height}$ can represent the height of a grid cell (e.g., expressed in number of tracks) in which a sub-wire is being track assigned, and $SW_{length}$ can represent the length of the sub-wire being track assigned (e.g., measured in db units).

TABLE 1

| Condition Resulting from Track Assignment | Equation |
|---|---|
| Sub-wire Overlaps with Another Wire | $4 \times GCell_{height} \times SW_{length}$ |
| Non-Default Rule Track Used | $2 \times GCell_{height} \times SW_{length}$ |
| Shield Track Used | $1 \times GCell_{height} \times SW_{length}$ |
| Blocked Track Used | $127 \times GCell_{height} \times SW_{length}$ |
| Deviation Cost | if( track > bestLocHi) (track − bestLocHi) × $SW_{length}$ else if( track < besLocLo) (bestLocLo − track) × $SW_{length}$ else 0 |

A potential cost can be computed when trying to assign each sub-wire to each candidate track (e.g., every track assignment possibility) and, as described herein, dynamic programming can assist in generating a track assignment solution with overall minimum cost. With respect to deviation cost, each sub-wire can have an initial assignment location that can be a range (e.g., ranging from[bestLocLo, bestLocHi]) and the range can be computed after identifying one or more routing wires but before finding breaking points for those routing wires.

For some embodiments, the dynamic programming process comprises determining a potential cost of shifting the candidate sub-wire from a first track on a current level to a second track on another level. Depending on the embodiment, the cost of shifting the candidate sub-wire from the first track to the second track can be based on a grid cell dimension, or based on a delta value between the second track and the first track. An example equation for determining a shift cost associated with assigning a sub-wire to a track is provided below (as Equation 1), where ShiftCostFactor can be a user-defined factor (e.g., determined based on user-based testing and adjustment), $GCell_{height}$ can represent the height of a grid cell (e.g., measured in db units) in which a sub-wire is being track assigned, and Δtrack can represent the difference in track levels between two sub-wires.

| Equation 1 |  |
|---|---|
| Shift Cost | ShiftCostFactor × $GCell_{height}$ + Δtrack |

Figure 6:
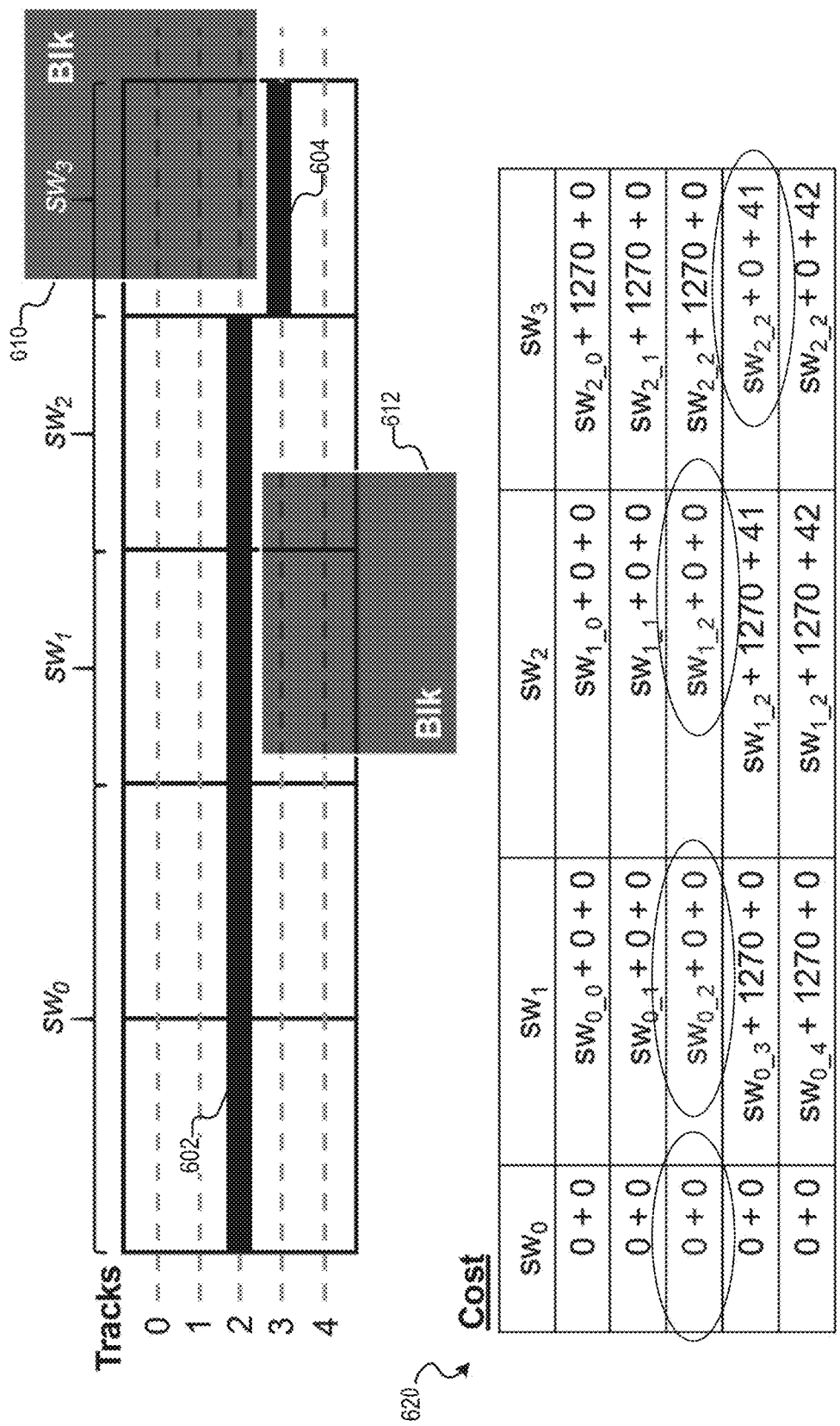
FIGS. 6 and 7 illustrate example cases of where a connected set of sub-wires is generated, according to some embodiments
Figure 7:
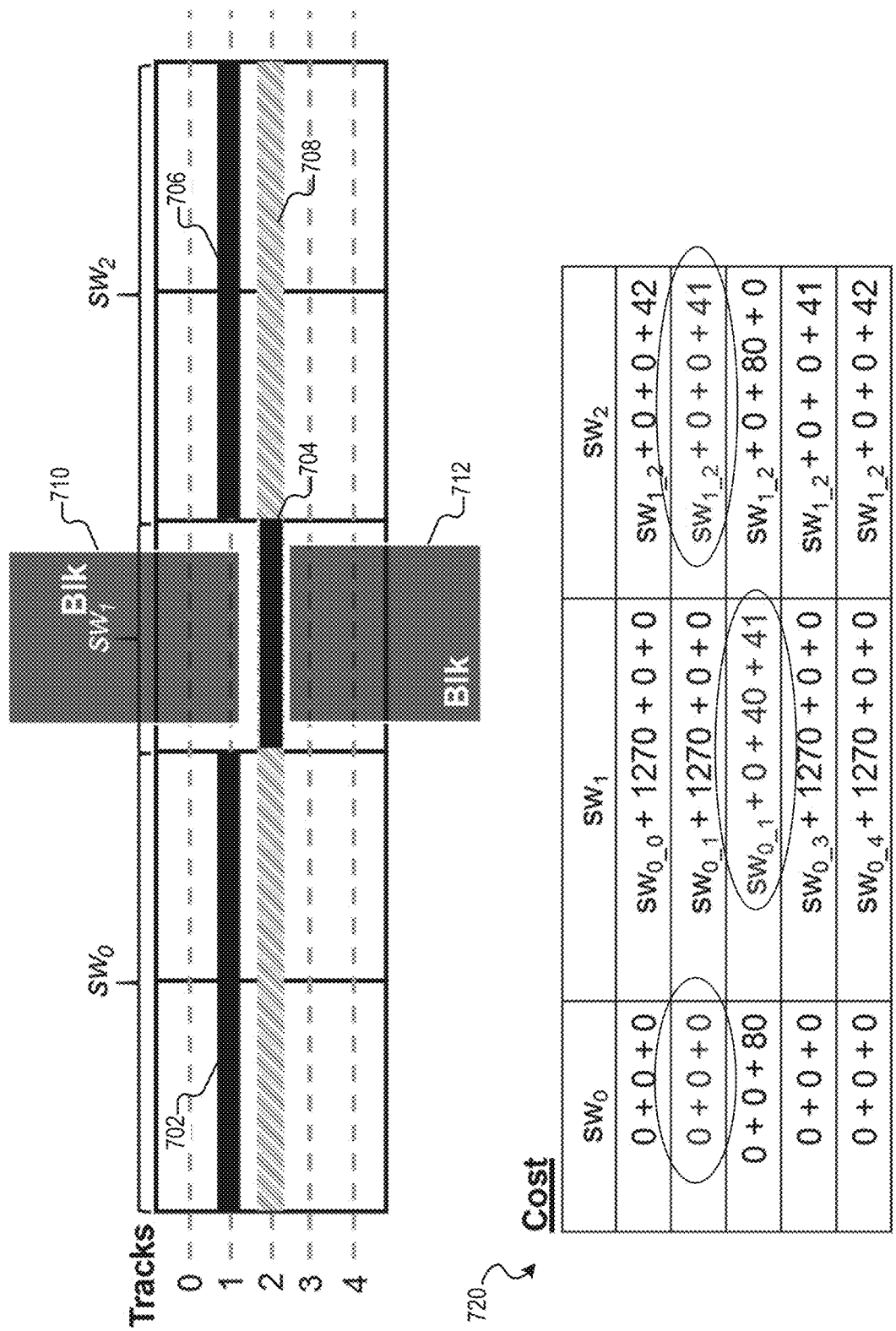

Examples of cost determinations using Table 1 and Equation 1 are described and illustrated herein with respect to FIGS. 6 and 7.

According to particular embodiments, the dynamic programming process uses (e.g., generates) a graph comprising a set of nodes and a set of edges, where an individual node of the graph is associated with a cost of assigning a candidate sub-wire to an individual track, and where an individual edge to the individual node is associated with a cost of shifting the candidate sub-wire between different track assignments. As described herein, a candidate sub-wire can be formed between two candidate breaking points in the set of candidate breaking points. Using the graph, some embodiments determine the set of selected breaking points and the set of selected track assignments (for sub-wires resulting from applying the set of selected breaking points to the individual routing wire) by determining (e.g., identifying) a minimum cost path in the graph. An example of a dynamic programming process that uses (e.g., generates) a graph described and illustrated herein with respect to FIG. 5.

Eventually, operation 226 generates, from the individual routing wire, a set of track-assigned sub-wires based on the set of selected breaking points and the set of selected track assignments determined by operation 224. For some embodiments, at least two track-assigned sub-wires in the set of track-assigned sub-wires are assigned to tracks having different levels. According to some embodiments, each track-assigned sub-wire is formed between two selected breaking points in the set of selected breaking points.

Referring now to FIG. 3, the flowchart illustrates the example method 300 for track assignment of wires of a network of a circuit design by dynamic programming, according to some embodiments. For some embodiments, one or more operations of the method 300 are performed as part of a global routing process performed with respect to a circuit design (e.g., by an EDA software system).

As illustrated, at operation 302, circuit design data is accessed, where the design data describes a circuit design after global routing is performed on a circuit design (where the global routing results in a global-routed circuit design). As described herein, the global-routed circuit design can comprise one or more two-dimensional (2D) routed networks that connect nodes (e.g., pins or vias) of the circuit design together according to a netlist that describes the circuit design. Subsequently, at operation 304, a layer-assigned circuit design is generated based on the circuit design data accessed by operation 302. For some embodiments, operation 304 comprises performing layer assignment on the global-routed circuit design. As described herein, the layer assignment can comprise a process that layer assigns different portions of a 2D routed network to different layers of the circuit design.

Thereafter, operation 306 generates a track-assigned circuit design by performing track assignment on the layer-assigned circuit design. As shown, operation 306 comprises performing operations 320 through 328. For some embodiments, operation 320 through 326 are respectively similar to operations 220 through 226 described above with respect to the method 200 of FIG. 2. At operation 328, a set of connections is generated between adjacent track-assigned sub-wires in the set of track-assigned sub-wires, thereby generating a connected set of track-assigned sub-wires. According to various embodiments, the connected set of track-assigned sub-wires is intended to be used in place of the individual routing wire in the track-assigned circuit design. An example of a connected set of track-assigned sub-wires is described and illustrated herein with respect to FIG. 8.

Eventually, at operation 308, a set of pin connections is generated between the connected set of track-assigned sub-wires and a set of pins of the track-assigned circuit design. In doing so, the connected set of track-assigned sub-wires can function as a route that connects two or more nodes of a network together on a given layer of the circuit design. An example of this is described and illustrated herein with respect to FIG. 8.

Figure 4:
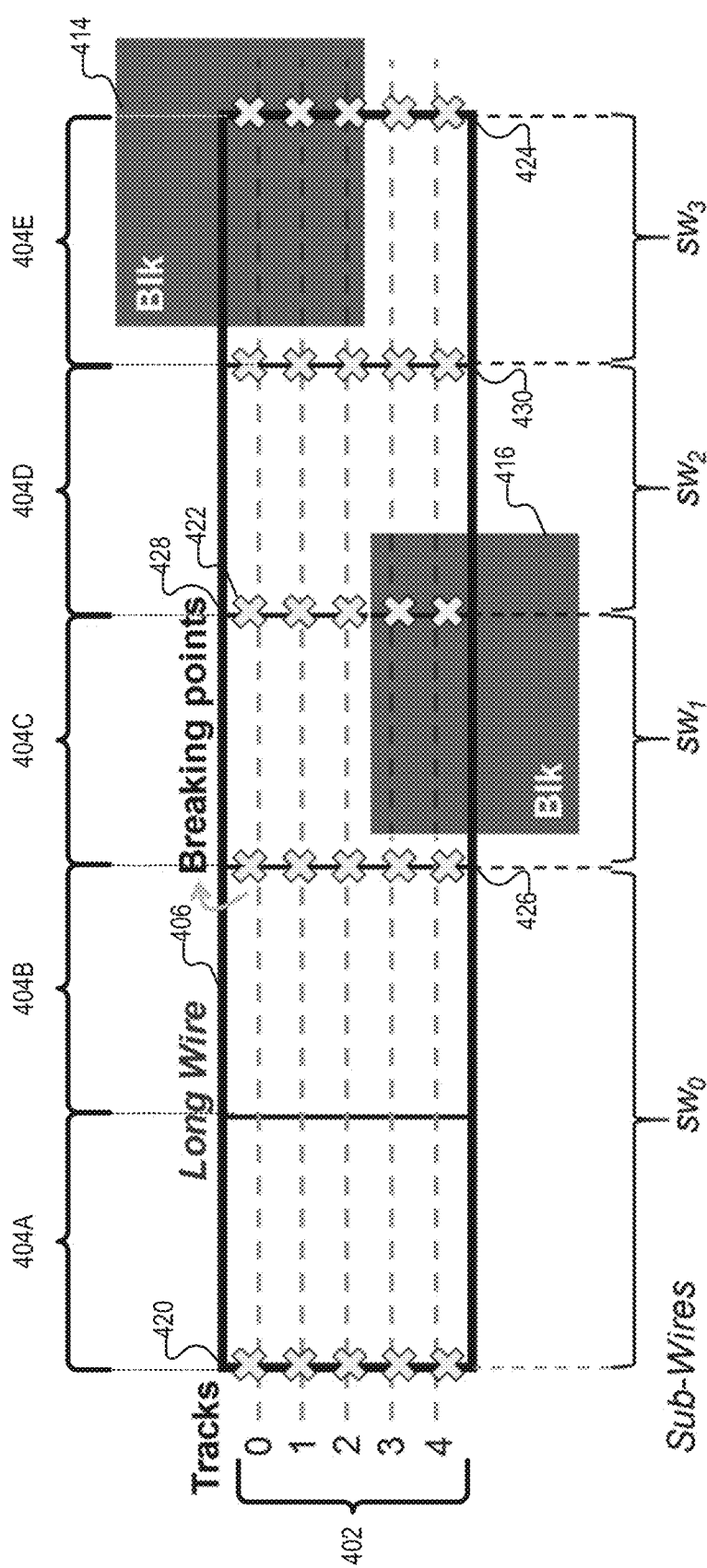
FIG. 4 is a diagram illustrating an example of candidate breaking points and candidate sub-wires for a routing wire, according to some embodiments.

FIG. 4 is a diagram illustrating an example of candidate breaking points 422 and candidate sub-wires (sub-routes) for a routing wire, according to some embodiments. In FIG. 4, rectangle 406 represents grid cells 404A, 404B, 404C, 404D, and 404E (hereafter, collectively referred to as grid cells 404) that the path of the routing wire is determined to span, and each of the x-marks represents a location, along one of the tracks 402, for one of the candidate breaking points 422. As shown by rectangle 406, the path of the routing wire encounters circuit design blockages 414 and 416. In accordance with some embodiments, candidate breaking points 422 are determined (e.g., identified) at grid cell boundary 420, which represents where the routing wire will start, and at grid cell boundary 424, which represents where the routing wire will end. Additionally, in accordance with some embodiments, candidate breaking points 422 are determined at grid cell boundaries 426, 428, and 430, as each of grid cells 404C, 404D, and 404E contain (e.g., intersect with) at least a portion of a circuit design blockage (e.g., 414 or 416). As a result of applying the candidate breaking points 422 to the routing wire, candidate sub-wires sw0, sw1, sw2, and sw3 would result. As illustrated in FIG. 4, an embodiment described herein can assign candidate sub-wire $sw_0$ to one of tracks 0 through 4, assign candidate sub-wire $sw_1$ to one of tracks 0 through 2 (based on circuit blockage 416), assign candidate sub-wire $sw_2$ to one of tracks 0 through 2 (based on circuit blockage 416), and assign candidate sub-wire $sw_3$ to one of tracks 3 or 4 (based on circuit blockage 414).

Figure 5:
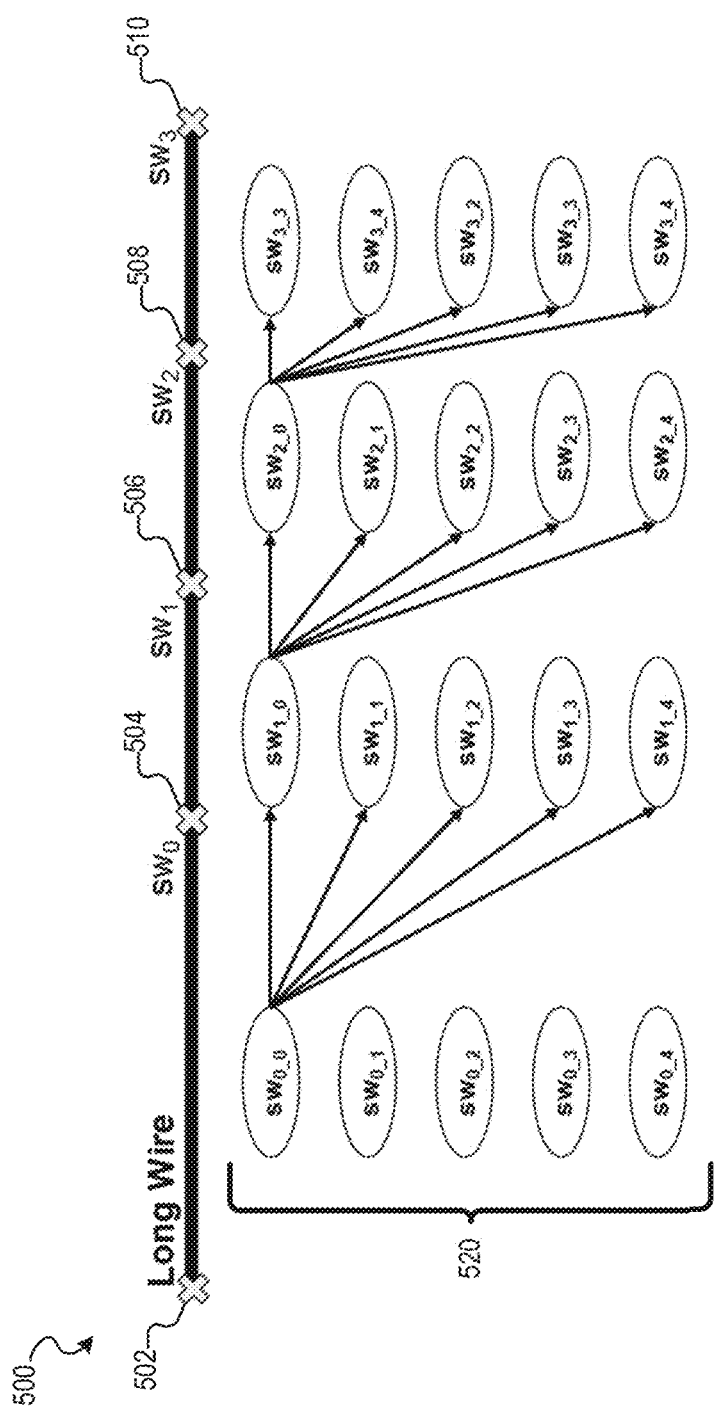
FIG. 5 is a diagram illustrating an example of using a dynamic programming process to determine breaking points and track assignments for a routing wire, according to some embodiments.

FIG. 5 is a diagram illustrating an example of using a dynamic programming process to determine (e.g., select) breaking points and track assignments for a routing wire 500, according to some embodiments. As described herein, some embodiments use a dynamic programming process to determine a set of selected breaking points and a set of selected track assignments based on a set of candidate breaking points 422. In FIG. 5, the routing wire 500 has candidate breaking points 422 at location 502, 504, 506, 508, and 510, where breaking points at locations 502 and 504 form candidate sub-wire $sw_0$, breaking points at locations 504 and 506 form candidate sub-wire $sw_1$, breaking points at locations 506 and 508 form candidate sub-wire $sw_2$, and breaking points at locations 508 and 510 form candidate sub-wire $sw_3$. The modeling used by the dynamic programming process to consider/evaluate costs of different track assignments of the different candidate sub-wires is represented by graph 520. In graph 520, each node $sw_{i,j}$ can represent a potential cost of assigning a sub-wire $sw_i$ to a track j, and each edge between $sw_{i,j}$ to $sw_{i+1,k}$ can represent a potential cost of shifting from a track level j to track level k between two adjacent sub-wires $sw_i$ and $sw_{i+1}$. Depending on the embodiment, the node costs can be determined according to one or more equations provided in Table 1, while the edge cost can be determined according to Equation 1. According to various embodiments, based on graph 520, the selected breaking points and the selected track assignments (for sub-wires resulting from applying the selected breaking points to the routing wire 500) are determined by determining (e.g., identifying) a minimum cost path in graph 520.

FIGS. 6 and 7 illustrate example cases of where a connected set of sub-wires is generated, according to some embodiments. In particular, FIG. 6 illustrates a case where a connected set of sub-wires is generated such that the sub-wires 602 and 604 avoid overlapping with circuit blockages 610 and 612, and FIG. 7 illustrates a case where a connected set of sub-wires is generated such that the sub-wires 702, 704, 706 minimize wire overlap with a previously track-assigned wire 708 while avoiding overlap with circuit blockages 710 and 712.

Referring now to FIG. 6, table 620 illustrates calculation of potential costs determined by a dynamic programming process that uses (e.g., generates) a graph as described herein (e.g., similar to graph 520 of FIG. 5), uses equations provided by Table 1 for node costs, and that uses Equation 1 for edge costs. For costs provided in table 620, the $GCell_{height}$ is set to 10 and the ShiftCostFactor is set to 4. The cost calculation for each candidate sub-wire used_cost+shift_cost where this is the cost is for candidate sub-wire $sw_i$ being assigned track m, where $sw_{i-1\_m}$ represents the cost of the prior adjacent sub-wire (the parent sub-wire) if assigned to track m, where blocked_track_used_cost is provided by Table 1, and where shift_cost is provided by $sw_0$, $sw_1$, $sw_2$, and $sw_3$ is expressed by Equation 2 as follows:
$sw_{i-1\_m}$+blocked_track_quation 1. In table 620, the blocked_track_used_cost is being used to determine costs of assigning each candidate sub-wire to different tracks (0 through 4) because tracks 3 and 4 are blocked by circuit design blockage 612 and because tracks 0, 1, and 2 are blocked by circuit design blockage 610. The expressions circled in table 620 highlight the minimum path cost in a graph used (e.g., generated) by a dynamic programming process, which according to some embodiments, results in the selected track assignments for sub-wires 602 and 604 (e.g., track 2 for sub-wire 602 and track 3 for sub-wire 604).

Referring now to FIG. 7, table 720 illustrates calculation of potential costs determined by a dynamic programming process that uses (e.g., generates) a graph as described herein (e.g., similar to graph 520 of FIG. 5), uses equations provided by Table 1 for node costs, and that uses Equation 1 for edge costs. For costs provided table 720, the $GCell_{height}$ is set to 10, the ShiftCostFactor is set to 4, and the cost calculation for each candidate sub-wires $sw_0$, sw1, and sw2 is expressed by Equation 2 as follows:

$sw_{i-1\_m}$+blocked_track_used_cost+sub-wire_overlaps_with_another_cost+shift_cost where this is the cost for candidate sub-wire $sw_i$ being assigned track m, where $sw_{i-1\_m}$ represents the cost of the prior adjacent sub-wire (the parent sub-wire) if assigned to track m, where blocked_track_used_cost and sub-wire_overlaps_with_another_cost are provided by Table 1, and where shift_cost is provided by Equation 1. In table 720, the blocked_track_used_cost is being used to determine costs of assigning each candidate sub-wire to different tracks (0 through 4) because tracks 0 and 1 are blocked by circuit design blockage 710 and because tracks 3 and 4 are blocked by circuit design blockage 712. Additionally, the sub-wire_overlaps_with_another_cost is being used to determine costs of assigning each candidate sub-wire to different tracks (0 through 4) because previously assigned wire 708 is assigned to track 2. The expressions circled in table 720 highlight the minimum path cost in a graph used (e.g., generated) by a dynamic programming process which, according to some embodiments, results in the selected track assignments for sub-wires 702 and 704 (e.g., track 1 for sub-wire 702, track 2 for sub-wire 704, and track 1 for sub-wire 706).

Figure 8:
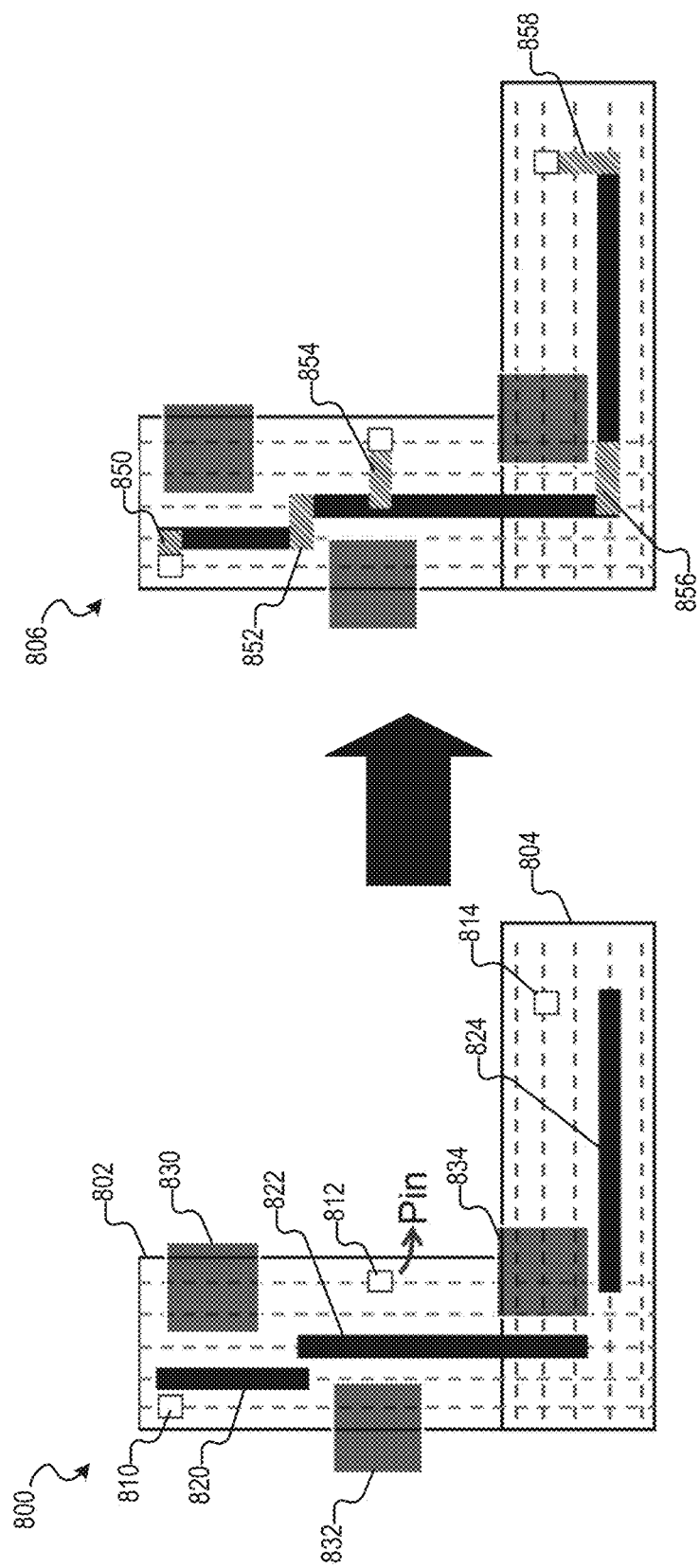
FIG. 8 is a diagram illustrating an example of generating a set of connections between track-assigned sub-wires and between pins and a connected set of track-assigned sub-wires, according to some embodiments.

FIG. 8 is a diagram illustrating an example of generating a set of connections between track-assigned sub-wires and between pins and a connected set of track-assigned sub-wires, according to some embodiments. Circuit design 800 illustrates a circuit design prior to generation of connections, while circuit design 806 illustrates the same circuit design after generation of connections. As shown, circuit design 800 comprises vertical tracks 802, horizontal tracks 804, pins 810, 812, and 814, track-assigned sub-wires (sub-routes) 820, 822, and 824, and circuit blockages 830, 832 and 834. Circuit design 800 illustrates how some embodiments can generate connections 852 and 856 to connect the track-assigned sub-wires 820, 822, and 824 together, thereby forming a connected set of track-assigned sub-wires that serves as a route between pins 810, 812, and 814. Additionally, circuit design 806 illustrates how some embodiments generate connection 850 between pin 810 and sub-wire 820, connection 854 between pin 812 and sub-wire 822, and connection 858 between pin 814 and sub-wire 824.

Figure 9:
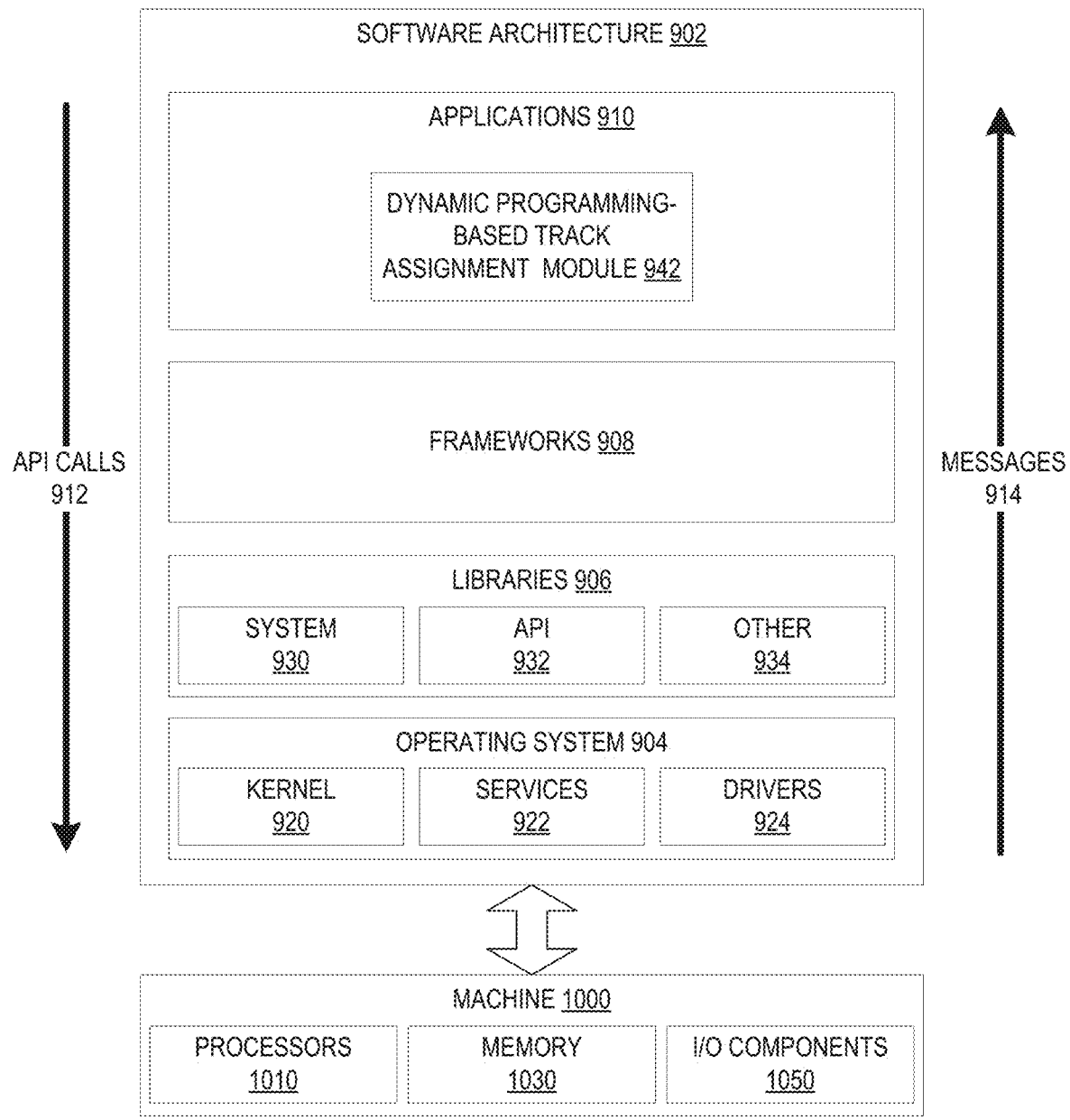
FIG. 9 is a block diagram illustrating an example of a software architecture that may be operating on an EDA computing device and may be used with methods for track assignment of wires of a network of a circuit design by dynamic programming, according to some embodiments.

FIG. 9 is merely a non-limiting example of a software architecture 902, and it will be appreciated that many other architectures can be implemented to facilitate the functionality described herein. In various embodiments, the software architecture 902 is implemented by hardware such as a machine 1000 of FIG. 10 that includes processors 1010 (e.g., hardware processors), memory 1030, and input/output (I/O) components 1050. In this example, the software architecture 902 can be conceptualized as a stack of layers where each layer may provide a particular functionality. For example, the software architecture 902 includes layers such as an operating system 904, libraries 906, software frameworks 908, and applications 910. Operationally, the applications 910 invoke application programming interface (API) calls 912 through the software stack and receive messages 914 in response to the API calls 912, consistent with some embodiments. In various embodiments, any client device, any server computer of a server system, or any other device described herein may operate using elements of the software architecture 902. An EDA computing device described herein may additionally be implemented using aspects of the software architecture 902, with the software architecture 902 adapted for operating to track assignment in any manner described herein.

In some embodiments, an EDA application of the applications 910 performs track assignment of wires of a network of a circuit design by dynamic programming according to embodiments described herein using various modules within the software architecture 902. For example, in some embodiments, an EDA computing device similar to the machine 1000 includes the memory 1030 and the one or more processors 1010. The processors 1010 also implement a dynamic programming-based track assignment module 942 (hereafter, the track assignment module 942) for track assignment of wires of a network of a circuit design by dynamic programming, in accordance with various embodiments described herein.

In various other embodiments, rather than being implemented as modules of the one or more applications 910, the track assignment module 942 may be implemented using elements of the libraries 906, the operating system 904, or the software frameworks 908.

In various implementations, the operating system 904 manages hardware resources and provides common services. The operating system 904 includes, for example, a kernel 920, services 922, and drivers 924. The kernel 920 acts as an abstraction layer between the hardware and the other software layers, consistent with some embodiments. For example, the kernel 920 provides memory management, processor management (e.g., scheduling), component management, networking, and security settings, among other functionality. The services 922 can provide other common services for the other software layers. The drivers 924 are responsible for controlling or interfacing with the underlying hardware, according to some embodiments. For instance, the drivers 924 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 906 provide a low-level common infrastructure utilized by the applications 910. The libraries 906 can include system libraries 930 such as libraries of blocks for use in an EDA environment or other libraries that can provide functions such as memory allocation functions, string manipulation functions, mathematic functions, and the like. In addition, the libraries 906 can include API libraries 932 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 906 may also include other libraries 934.

The software frameworks 908 provide a high-level common infrastructure that can be utilized by the applications 910, according to some embodiments. For example, the software frameworks 908 provide various graphic user interface (GUI) functions, high-level resource management, high-level location services, and so forth. The software frameworks 908 can provide a broad spectrum of other APIs that can be utilized by the applications 910, some of which may be specific to a particular operating system 904 or platform. In various embodiments, the systems, methods, devices, and instructions described herein may use various files, macros, libraries, and other elements of an EDA design environment to implement track assignment of wires of a network of a circuit design by dynamic programming as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 902, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose hardware processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors 1010 that are temporarily configured (e.g., by software) or permanently configured to perform the relevant operations. Whether temporarily or permanently configured, such processors 1010 constitute processor-implemented modules that operate to perform one or more operations or functions described herein. As used herein, "processor-implemented module" refers to a hardware module implemented using one or more processors 1010.

Similarly, the methods described herein can be at least partially processor-implemented, with a particular processor or processors 1010 being an example of hardware. For example, at least some of the operations of a method can be performed by one or more processors 1010 or processor-implemented modules. Moreover, the one or more processors 1010 may also operate to support performance of the relevant operations in a "cloud computing" environment or as a "software as a service" (SaaS). For example, at least some of the operations may be performed by a group of computers (as examples of machines 1000 including processors 1010), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors 1010, not only residing within a single machine 1000, but deployed across a number of machines 1000. In some embodiments, the processors 1010 or processor-implemented modules are located in a single geographic location (e.g., within a home environment, an office environment, or a server farm). In some other embodiments, the processors 1010 or processor-implemented modules are distributed across a number of geographic locations.

Figure 10:
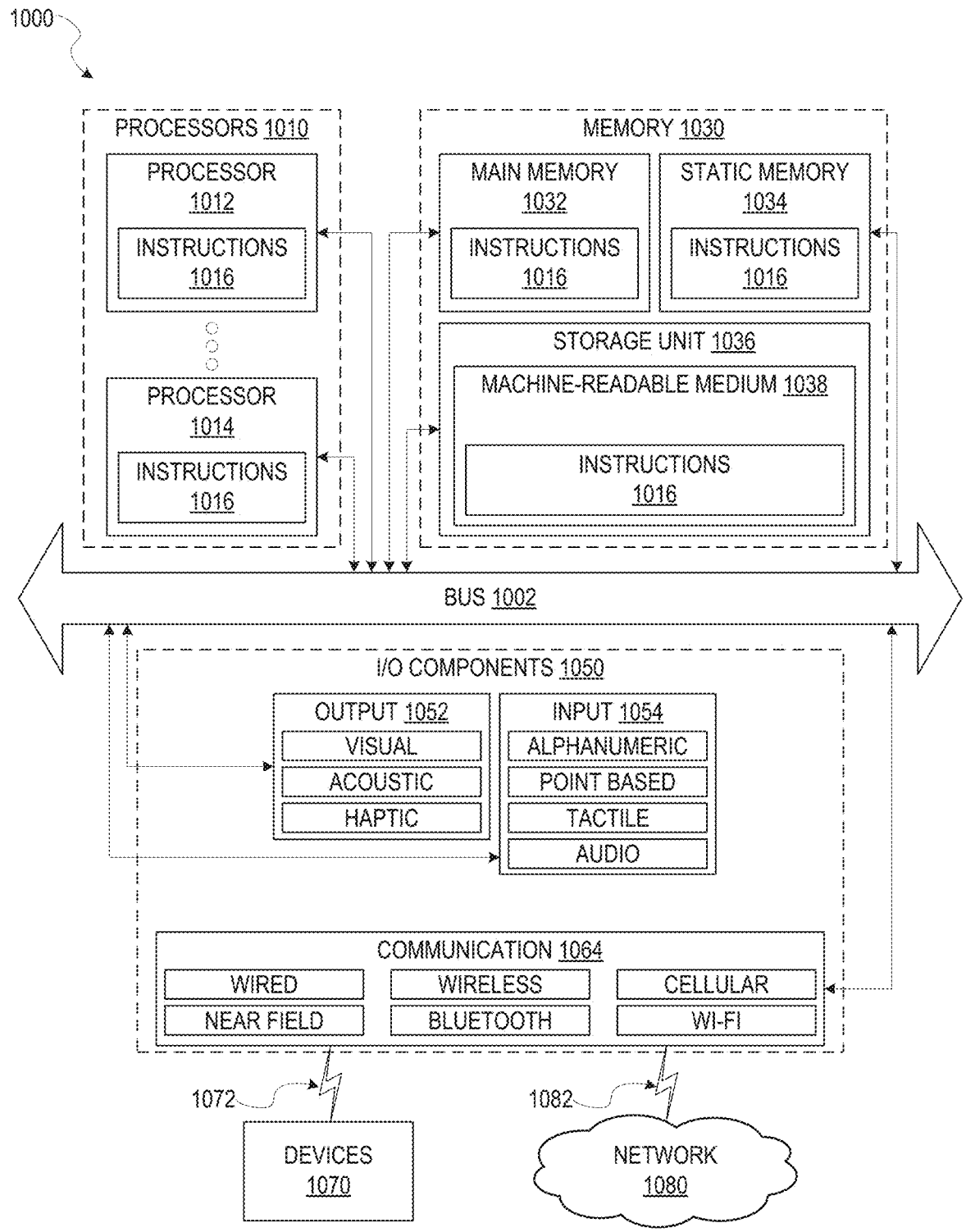
FIG. 10 is a diagram representing a machine in the form of a computer system within which a set of instructions are executed, causing the machine to perform any one or more of the methods discussed herein, according to some embodiments.

FIG. 10 is a diagrammatic representation of the machine 1000 in the form of a computer system within which a set of instructions may be executed for causing the machine 1000 to perform any one or more of the methodologies discussed herein, according to some embodiments. FIG. 10 shows components of the machine 1000, which is, according to some embodiments, able to read instructions from a machine-readable medium (e.g., a machine-readable storage medium) and perform any one or more of the methodologies discussed herein. Specifically, FIG. 10 shows a diagrammatic representation of the machine 1000 in the example form of a computer system, within which instructions 1016 (e.g., software, a program, an application, an applet, an app, or other executable code) for causing the machine 1000 to perform any one or more of the methodologies discussed herein can be executed. In alternative embodiments, the machine 1000 operates as a standalone device or can be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 can comprise, but not be limited to, a server computer, a client computer, a personal computer (PC), a tablet computer, a laptop computer, a netbook, or any machine capable of executing the instructions 1016, sequentially or otherwise, that specify actions to be taken by the machine 1000. Further, while only a single machine 1000 is illustrated, the term "machine" shall also be taken to include a collection of machines 1000 that individually or jointly execute the instructions 1016 to perform any one or more of the methodologies discussed herein.

In various embodiments, the machine 1000 comprises processors 1010, memory 1030, and I/O components 1050, which can be configured to communicate with each other via a bus 1002. In some embodiments, the processors 1010 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 1012 and a processor 1014 that may execute the instructions 1016. The term "processor" is intended to include multi-core processors 1010 that may comprise two or more independent processors 1012, 1014 (also referred to as "cores") that can execute the instructions 1016 contemporaneously. Although FIG. 10 shows multiple processors 1010, the machine 1000 may include a single processor 1012 with a single core, a single processor 1012 with multiple cores (e.g., a multi-core processor 1012), multiple processors 1010 with a single core, multiple processors 1010 with multiple cores, or any combination thereof.

The memory 1030 comprises a main memory 1032, a static memory 1034, and a storage unit 1036 accessible to the processors 1010 via the bus 1002, according to some embodiments. The storage unit 1036 can include a machine-readable medium 1038 on which are stored the instructions 1016 embodying any one or more of the methodologies or functions described herein. The instructions 1016 can also reside, completely or at least partially, within the main memory 1032, within the static memory 1034, within at least one of the processors 1010 (e.g., within the processor's cache memory), or any suitable combination thereof, during execution thereof by the machine 1000. Accordingly, in various embodiments, the main memory 1032, the static memory 1034, and the processors 1010 are considered machine-readable media 1038.

As used herein, the term "memory" refers to a machine-readable medium 1038 able to store data temporarily or permanently and may be taken to include, but not be limited to, random-access memory (RAM), read-only memory (ROM), buffer memory, flash memory, and cache memory. While the machine-readable medium 1038 is shown, in some embodiments, to be a single medium, the term "machine-readable medium" should be taken to include a single medium or multiple media (e.g., a centralized or distributed database, or associated caches and servers) able to store the instructions 1016. The term "machine-readable medium" shall also be taken to include any medium, or combination of multiple media, that is capable of storing instructions (e.g., the instructions 1016) for execution by a machine (e.g., the machine 1000), such that the instructions 1016, when executed by one or more processors of the machine 1000 (e.g., the processors 1010), cause the machine 1000 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1050 include a wide variety of components to receive input, provide output, produce output, transmit information, exchange information, capture measurements, and so on. In general, it will be appreciated that the I/O components 1050 can include many other components that are not shown in FIG. 10. The I/O components 1050 are grouped according to functionality merely for simplifying the following discussion, and the grouping is in no way limiting. In various embodiments, the I/O components 1050 include output components 1052 and input components 1054. The output components 1052 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1054 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1050 may include communication components 1064 operable to couple the machine 1000 to a network 1080 or devices 1070 via a coupling 1082 and a coupling 1072, respectively. For example, the communication components 1064 include a network interface component or another suitable device to interface with the network 1080. In further examples, the communication components 1064 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1070 may be another machine or any of a wide variety of peripheral devices (e.g., a peripheral device coupled via a USB).

In various embodiments, one or more portions of the network 1080 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1080 or a portion of the network 1080 may include a wireless or cellular network, and the coupling 1082 may be a Code Division Multiple Access (CDMA) connection, a Global System for Mobile communications (GSM) connection, or another type of cellular or wireless coupling.

Furthermore, the machine-readable medium 1038 is non-transitory (in other words, not having any transitory signals) in that it does not embody a propagating signal. However, labeling the machine-readable medium 1038 "non-transitory" should not be construed to mean that the machine-readable medium 1038 is incapable of movement; the machine-readable medium 1038 should be considered as being transportable from one physical location to another. Additionally, since the machine-readable medium 1038 is tangible, the machine-readable medium 1038 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions 1016, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
    generating, by a hardware processor, a layer-assigned circuit design by performing layer assignment on a global-routed circuit design based on circuit design data; and
    generating, by the hardware processor, a track-assigned circuit design by performing track assignment on the layer-assigned circuit design, the performing track assignment comprising:
    determining a set of routing wires of the layer-assigned circuit design, each routing wire in the set of routing wires spanning two or more grid cells of a layer;
    generating a set of candidate breaking points for an individual routing wire in the set of routing wires;
    determining a set of selected breaking points and a set of selected track assignments based on the set of candidate breaking points, the determining the set of selected breaking points and the set of selected track assignments comprising a dynamic programming process that uses a graph that includes a set of nodes and a set of edges, an individual node of the graph being associated with a cost of assigning a candidate sub-wire to an individual track, an individual edge to the individual node being associated with a cost of shifting the candidate sub-wire between different track assignments, and the candidate sub-wire being formed between two candidate breaking points in the set of candidate breaking points;
    generating, from the individual routing wire, a set of track-assigned sub-wires based on the set of selected breaking points and the set of selected track assignments; and
    generating a set of connections between adjacent track-assigned sub-wires in the set of track-assigned sub-wires to generate a connected set of track-assigned sub-wires, the connected set of track-assigned sub-wires to be used in place of the individual routing wire in the track-assigned circuit design.

2. The method of claim 1, wherein each candidate breaking point in the set of candidate breaking points represents a location on the individual routing wire at which to potentially form a break to generate two sub-wires.

3. The method of claim 1, wherein each track-assigned sub-wire is formed between two selected breaking points in the set of selected breaking points.

4. The method of claim 1, further comprising:
    generating, by the hardware processor, a set of pin connections between the connected set of track-assigned sub-wires and a set of pins of the track-assigned circuit design.

5. The method of claim 1, wherein a candidate breaking point in the set of candidate breaking points is disposed at a location on the individual routing wire where the individual routing wire starts or where the individual routing wire ends.

6. The method of claim 1, wherein a candidate breaking point in the set of candidates breaking points is disposed at a location on the individual routing wire where the individual routing wire intersects a boundary of a grid cell that contains a portion of a circuit design blockage.

7. The method of claim 1, wherein the dynamic programming process comprises:
    determining a potential cost of assigning the candidate sub-wire, formed between the two candidate breaking points in the set of candidate breaking points, to the individual track.

8. The method of claim 7, wherein the potential cost is based on whether assigning the candidate sub-wire to the individual track results in wire overlap.

9. The method of claim 7, wherein the potential cost is based on whether the individual track comprises at least one of a shield track, a blocked track, or a non-default routing track.

10. The method of claim 1, wherein the dynamic programming process comprises:
   determining a potential cost of shifting the candidate sub-wire from a first track on a current level to a second track on another level.

11. The method of claim 10, wherein the cost of shifting the candidate sub-wire from the first track to the second track is based on a grid cell dimension.

12. The method of claim 10, wherein the cost of shifting the candidate sub-wire from the first track to the second track is based on a delta value between the second track and the first track.

13. The method of claim 1, wherein the dynamic programming process comprises:
   determining a set of candidate sub-wires from the individual routing wire based on the set of candidate breaking points;
   for each candidate sub-wire in the set of candidate sub-wires, determining a set of potential costs of assigning the candidate sub-wire to each track available to the candidate sub-wire; and
   determining the set of selected breaking points and the set of selected track assignments based on the sets of potential costs generated for the set of candidate sub-wires.

14. A device comprising:
   a memory storing instructions; and
   a hardware processor communicatively coupled to the memory and configured by the instructions to perform operations comprising:
      accessing circuit design data that describes a global-routed circuit design after global routing is performed on a circuit design;
      generating a layer-assigned circuit design by performing layer assignment on the global-routed circuit design based on the circuit design data; and
      generating a track-assigned circuit design by performing track assignment on the layer-assigned circuit design, the performing track assignment comprising:
         determining a set of routing wires of the layer-assigned circuit design, each routing wire in the set of routing wires spanning two or more grid cells of a layer;
         generating a set of candidate breaking points for an individual routing wire in the set of routing wires;
         determining a set of selected breaking points and a set of selected track assignments based on the set of candidate breaking points, the determining the set of selected breaking points and the set of selected track assignments comprising a dynamic programming process that uses a graph that includes a set of nodes and a set of edges, an individual node of the graph being associated with a cost of assigning a candidate sub-wire to an individual track, an individual edge to the individual node being associated with a cost of shifting the candidate sub-wire between different track assignments, and the candidate sub-wire being formed between two candidate breaking points in the set of candidate breaking points; and
         generating, from the individual routing wire, a set of track-assigned sub-wires based on the set of selected breaking points and the set of selected track assignments.

15. The device of claim 14, wherein the performing the track assignment further comprises:
   generating a set of connections between adjacent track-assigned sub-wires in the set of track-assigned sub-wires to generate a connected set of track-assigned sub-wires, the connected set of track-assigned sub-wires to be used in place of the individual routing wire in the track-assigned circuit design.

16. The device of claim 14, wherein the dynamic programming process comprises:
   determining a potential cost of assigning the candidate sub-wire, formed between the two candidate breaking points in the set of candidate breaking points, to the individual track.

17. The device of claim 14, wherein the dynamic programming process comprises:
   determining a potential cost of shifting the candidate sub-wire from a first track on a current level to a second track on another level.

18. The device of claim 14, wherein the dynamic programming process comprises:
   determining a set of candidate sub-wires from the individual routing wire based on the set of candidate breaking points;
   for each candidate sub-wire in the set of candidate sub-wires, determining a set of potential costs of assigning the candidate sub-wire to each track available to the candidate sub-wire; and
   determining the set of selected breaking points and the set of selected track assignments based on the sets of potential costs generated for the set of candidate sub-wires.

19. A non-transitory computer-readable medium comprising instructions that, when executed by a hardware processor of a device, cause the device to perform operations comprising:
   accessing circuit design data that describes a layer-assigned circuit design after layer assignment is performed on a circuit design; and
   performing track assignment on the layer-assigned circuit design based on the circuit design data, the performing track assignment comprising:
      determining a set of routing wires of the layer-assigned circuit design, each routing wire in the set of routing wires spanning two or more grid cells of a layer;
      generating a set of candidate breaking points for an individual routing wire in the set of routing wires;
      determining a set of selected breaking points and a set of selected track assignments based on the set of candidate breaking points, the determining the set of selected breaking points and the set of selected track assignments comprising a dynamic programming process that uses a graph that includes a set of nodes and a set of edges, an individual node of the graph being associated with a cost of assigning a candidate sub-wire to an individual track, an individual edge to the individual node being associated with a cost of shifting the candidate sub-wire between different track assignments, and the candidate sub-wire being formed between two candidate breaking points in the set of candidate breaking points; and
      generating, from the individual routing wire, a set of track-assigned sub-wires based on the set of selected breaking points and the set of selected track assignments.

20. The non-transitory computer-readable medium of claim 19, wherein the dynamic programming process comprises:
   determining a set of candidate sub-wires from the individual routing wire based on the set of candidate breaking points;

for each candidate sub-wire in the set of candidate sub-wires, determining a set of potential costs of assigning the candidate sub-wire to each track available to the candidate sub-wire; and determining the set of selected breaking points and the set of selected track assignments based on the sets of potential costs generated for the set of candidate sub-wires.

* * * * *